(12) United States Patent
Kinno et al.

(10) Patent No.: US 6,225,632 B1
(45) Date of Patent: May 1, 2001

(54) IMAGE DETECTION DEVICE

(75) Inventors: Akira Kinno; Kouhei Suzuki; Kazuki Taira, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/138,700

(22) Filed: Aug. 24, 1998

(30) Foreign Application Priority Data

Aug. 22, 1997 (JP) .................................................. 9-226720

(51) Int. Cl.$^7$ ...................................................... G01T 1/24
(52) U.S. Cl. .................. 250/370.09; 250/370.14
(58) Field of Search .................. 250/370.09, 370.08, 250/370.14

(56) References Cited

U.S. PATENT DOCUMENTS

| | | | |
|---|---|---|---|
| 5,610,403 | * 3/1997 | Kingsley et al. | 250/370.08 |
| 5,610,404 | * 3/1997 | Possin | 250/370.09 |
| 5,648,674 | * 7/1997 | Weisfield et al. | 257/428 |
| 5,693,947 | * 12/1997 | Morton | 250/370.09 |
| 5,777,335 | * 7/1998 | Mochizuki et al. | 250/370.09 |
| 5,852,296 | 11/1998 | Tsukamoto et al. . | |
| 6,044,128 | * 3/2000 | Tanaka et al. | 378/98.8 |

FOREIGN PATENT DOCUMENTS

| | | |
|---|---|---|
| 10-010237 | 1/1998 | (JP) . |
| 10-170658 | 6/1998 | (JP) . |

\* cited by examiner

*Primary Examiner*—Constantine Hannaher
*Assistant Examiner*—Albert Gagliardi
(74) *Attorney, Agent, or Firm*—Oblon, Spivak, McClelland, Maier & Neustadt, P.C.

(57) ABSTRACT

An image detection device having pixel electrodes arrayed in a matrix in an image detection area on one face of an insulating film. A shield electrode is disposed in the peripheral area on the outside the detection area, and a driving circuit for driving the pixel electrodes and wires connecting the pixel electrodes are provided on the other face of the insulating film. The driving circuit may be provided in the peripheral area. The wires disposed in the peripheral area are shielded by the shield electrode to prevent electrostatic breakdown even when a large current flows through a photoelectric converting film, thereby to improve reliability by preventing dielectric breakdown and to accommodate a large dynamic range of incident light.

13 Claims, 11 Drawing Sheets

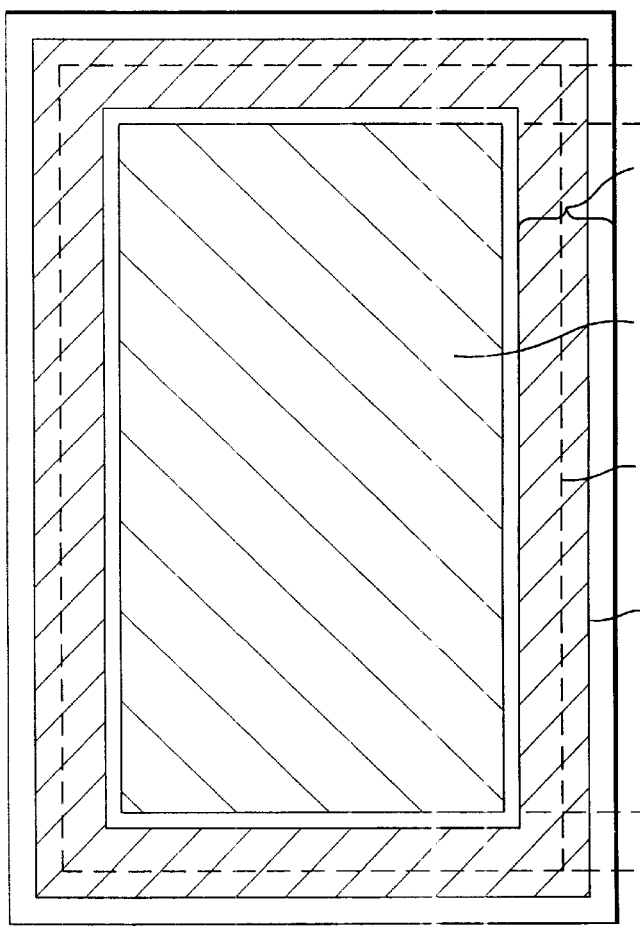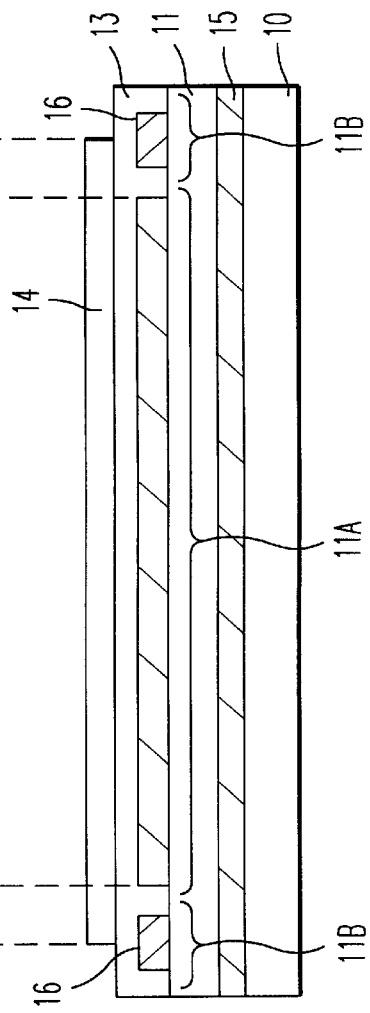
FIG. 1A
FIG. 1B

IMAGE DETECTION DEVICE

BACKGROUND OF THE INVENTION

1. Field of the Invention

The present invention relates to an image detection device for obtaining images by converting light signals into electrical signals and more particularly to an image detection device of a medical X-ray diagnostic system.

2. Discussion of Background

An image detection device using photoelectric converting elements as image detection elements is being widely used in video cameras, digital cameras and the like. It is also used in a medical X-ray diagnostic system instead of the conventional screen films.

The medical field is now trending toward making a data base of medical data of patients in order to be able to quickly and accurately give treatment. It is then required to make a data base of picture data obtained by X-ray photography and to digitize photographed X-ray pictures.

The conventional screen film has been used in the medical X-ray diagnostic system to take diagnostic pictures. However, it is necessary to develop the photographed film and then to scan the pictures by a scanner or the like to digitize the pictures, requiring considerable work and time. This method has had another problem that the image quality of the picture is lowered when scanned by the scanner.

A method of using a charge coupled device (CCD) camera whose size is as small as 1 inch square and of photographing directly to obtain digital images has been realized recently.

However, because it is necessary to photograph an area of about 30 cm×30 cm in photographing a human lung for example, it requires an optical apparatus for condensing light, causing a problem that the system is enlarged.

As a method for solving these problems, an image detection device using thin film transistors (TFT) using amorphous silicon (a-Si) as a semiconductor film has been proposed (e.g., U.S. Pat. No. 4,689,487).

There are two types of a-Si TFT image detection devices for converting X-rays into electric charges. One is called an indirect conversion image detection device which converts X-rays once into visible light by fluorescent substance or the like and then converts the visible light into electrical charges by means of a photoelectric converting film. The other is called a direct conversion image detection device which converts X-rays directly into electric charges by means of a photoelectric converting film.

While the indirect conversion image detection device allows to obtain pictures by converting X-rays into visible light by the fluorescent substance, it has a drawback that it is difficult to obtain enough spatial resolution because light scatters within the fluorescent substance.

Meanwhile, the direct conversion image detection device has merit in that it allows high spatial resolution image quality to be obtained because it requires no fluorescent substance which causes the deterioration of the spatial resolution. It is essential to be able to obtain high spatial resolution pictures for the purpose of medical use, so that the direct conversion image detection device is now drawing attention.

FIG. 9 is a schematic block diagram showing an overall system utilizing the image detection device. High voltage is supplied from a high voltage generating section 62 to an X-ray source 51. X-rays irradiated from the X-ray source 51 penetrate through a specimen 52 and enter photoelectric converting elements of an a-Si TFT image detection device 53. The a-Si TFT image detection device 53 converts the X-rays penetrated through the specimen 52 into an analog electrical signal corresponding to a dosage at the incident position of the photoelectric converting elements. The converted analog signal is then digitized by an A/D converter 57 to be stored in an image memory 58 in a time series manner.

The image memory 58 is capable of storing image data of one or several pictures sequentially at predetermined addresses under the control of control signals from a control section 63. An arithmetic processing section 59 implements arithmetic processing on the image data by taking it out of the image memory 58 so that it can be displayed appropriately and stores the result thereof again in the image memory 58. The processed image data in the image memory 58 is then converted into an analog signal by a D/A converter 60. This analog signal is output to an external processing circuit such as an image monitor 61 via an interface. Accordingly, an X-ray penetration image of the specimen 52 is displayed, for example, on the image monitor 61. The control section 63 also controls the high voltage generating section 62.

FIG. 10 is a schematic diagram showing the structure of the image detection section of the direct conversion image detection device using the a-Si TFTs. As shown in FIG. 10, pixels e, each of which is a unit element composing an image detection area, are arrayed in a matrix of 2000 (H)×2000 (V) for example (hereinafter referred to as a thin film transistor array).

Bias voltage is applied to a photoelectric converting film 140 from a power source 148. A drain of an a-Si TFT 144 is connected to a signal line 113. A gate of the a-Si TFT 144 is connected to a scan line 118. ON/OFF of the a-Si TFT 144 is controlled by potential of a scan signal applied from a scan line driving circuit 152 to a gate electrode via the scan line 118. A terminal end of the signal line 113 is connected to an amplifier 154 such as a sense amplifier for detecting signals.

FIGS. 11(a) and 11(b) are schematic diagrams showing a basic structure of the direct conversion image detection device, wherein FIG. 11(a) is a schematic section view of the image detection device and FIG. 11(b) is a diagram schematically showing an equivalent circuit of the unit pixel of the image detection device. Each pixel e comprises the thin film transistor 144 composed of the semiconductor film of a-Si, the photoelectric converting film 140 and a signal storage capacitor element Cs.

When light (X-rays, soft X-rays or the like in this case) enters the photoelectric converting film 140, a current flows through the photoelectric converting film 140 and electric charge is accumulated in a pixel capacitor Cs. When the scan line driving circuit 152 drives one scan line to turn ON all TFTs connected to the scan line, the accumulated charge is transferred to the amplifier 154 side via the signal line 113. An output amplitude of the amplifier 154 also changes corresponding to a difference in amounts of charge caused by a difference in quantities of light entering the pixels. The method shown in FIG. 10 allows a digital image to be obtained directly by converting the output signal of the amplifier 154 from analog to digital form.

The pixel shown in FIGS. 11(a) and 11(b) has a similar structure with an active matrix liquid crystal display using thin film transistors as switching elements (TFT-LCD), which is used for a notebook (laptop) personal computer and the like. Accordingly, a thin and large screen image detection device may be readily fabricated.

However, it is necessary to form the photoelectric converting film as thick as about several hundreds μm to several mm in the direct conversion image detection device in order to improve the efficiency of the conversion from X-rays to electric charges. Then, in order to apply an appropriate electric field to the photoelectric converting film, a high voltage of about several kV must be applied on the both sides of the photoelectric converting film.

As shown in FIGS. 11(*a*) and 11(*b*), the image detection area of the direct conversion image detection device includes the a-Si TFT 144, a storage capacity electrode 202, a pixel electrode 203, an insulating layer 204, the photoelectric converting film 140 and a voltage supplying wire 205 disposed on an insulated substrate 201. Also provided are the signal line 113 and the scan line 118 as shown in FIG. 10.

The signal storage capacitor element Cs is formed by pinching the insulating layer 204 between the storage capacitor electrode 202 and the pixel electrode 203.

A high voltage of about several kV is applied to the voltage supplying wire 205.

The resistance of the photoelectric converting film 140 decreases in proportion to the dosage of X-rays entering therein. Accordingly, when a predetermined dosage of X-ray enters the photoelectric converting film 140, a current flows between the voltage supplying wire 205 and the pixel electrode 203 and electric charge corresponding to the dosage of the X-rays is stored in the signal storage capacitor element Cs.

Because the electric charge stored in each pixel is proportional to the dosage of X-rays entering each pixel, the X-ray penetration image corresponding to the specimen may be detected as electric charges by arraying such image detection pixels two-dimensionally.

After accumulating the charges for a certain period of time, the scan line driving circuit 152 turns ON the a-Si TFT 144 to read the charge accumulated in the signal storage capacitor element Cs through the amplifier 154 to output to the circuit.

In the direct conversion image detection device having such structure, however, a large current flows through the photoelectric converting film 140 when intense X-rays enter the photoelectric converting film 140 and the potential of the pixel electrode 203 rises up to about several kV which is equal to that of the voltage supplying wire 205 in the worst case. When a large potential difference of several kV is generated between the pixel electrode 203 and the storage capacity electrode 202, there is a great possibility that the insulating layer 204 experiences dielectric breakdown, thus destroying the TFT array.

Accordingly, it has become necessary to suppress the potential of the pixel electrode 203 below a certain voltage and include a protection circuit within the pixel, as has been proposed in Japanese Patent Application Nos. Hei. 8-161977 and Hei. 8-32699 for example.

FIG. 12 is a diagram showing a peripheral edge portion of this image detection device. A high voltage of about several kV is applied also to a part other than the image detection area and there is a possibility that dielectric breakdown occurs in that part, thus destroying the thin film transistor array of the image detection area.

A high-voltage power cable 307 is connected to the voltage supplying wire 205 to apply the high voltage in the peripheral edge portion of the image detection area.

Normally, an electrodes—the scan line 118, the signal line 113 for reading signals, the storage capacity electrode 202 or the like—for driving the pixel section is led to the outer peripheral part of the substrate in order to be connected to the scan line driving circuit 152 and the amplifier 154, respectively. Accordingly, electrostatic capacitors C140, C206 and C204 are formed between the electrode 305 for driving the pixel section and the voltage supplying wire 205. Therefore, when X-rays enter the peripheral edge portion of the photoelectric converting film 140, a current flows between the voltage supplying wire 205 and the electrodes similarly to the image detection area. However, dielectric breakdown may occur and the TFT array of the image detection area may be destroyed when a high voltage of several kV is applied to the insulating layer 204 and the insulating film 206.

As described above, the conventional image detection device has had the problem that the insulating layer 204 and the insulating film 206 experience dielectric breakdown, thus destroying the image detection device, even in the peripheral portion of the image detection area similarly to the image detection area when high voltage is applied between the wires such as the scan line 118, the signal line 113 and the storage capacitor electrode 202 and the voltage supplying wire 205.

SUMMARY OF THE INVENTION

Accordingly, it is an object of the present invention to provide a highly reliable image detection device which hardly causes dielectric breakdown without a lowering of the resolution of a photographed image.

This and other objects are achieved according to the present invention by providing a new and improved image detection device having an image detection area, including a photoelectric conversion circuit configured to sense and convert X-rays into electrical signals and a peripheral area for transmitting the converted electrical signals to a peripheral circuit, wherein the photoelectric conversion circuit includes a photoelectric converting film configured to sense and convert incident X-rays into the electrical signal, and the image detection area includes a storage capacitor provided under the film and configured to store converted electrical charge and a thin film transistor which functions as a switch and is configured to take out the charge from the storage capacitor. The photoelectric converting film must be operated by applying high voltage.

Wires are provided to transmit the electrical charge converted from the corresponding to X-rays in the image detection area to an external signal processing circuit and a driving circuit in the peripheral area. The photoelectric converting film extends also in the peripheral area. In another embodiment, the driving circuit and others are provided in the peripheral area.

A shield electrode is provided between the photoelectric converting film and the wires provided in the peripheral area to prevent high voltage applied to the photoelectric converting film from causing dielectric breakdown. Accordingly, it is possible effectively to prevent the wires provided in the peripheral area from causing a short under high voltage.

That is, the image detection device of the present invention is characterized in that the shield electrode is disposed in the pixel area and the peripheral area in order to prevent dielectric breakdown which may otherwise occur in an insulating layer when high voltage is applied between the scan line, the signal line and the like and voltage applying means.

Because the high voltage is applied only to the photoelectric converting film by adopting such arrangement, the insulating layer on the opposite side from a light incident face of the pixel electrode will not be broken down by the high voltage.

Further, because the shield electrode disposed in the peripheral area has also an effect of a short ring, it prevents the thin film transistors from being destroyed by static electricity and the like during the production of array substrates, thus improving the productivity of the image detection devices.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1(a) and 1(b) are schematic diagrams respectively schematically showing a plan view of the image detection device of the present invention and a sectional view thereof;

DESCRIPTION OF THE PREFERRED EMBODIMENTS

Figure 2:
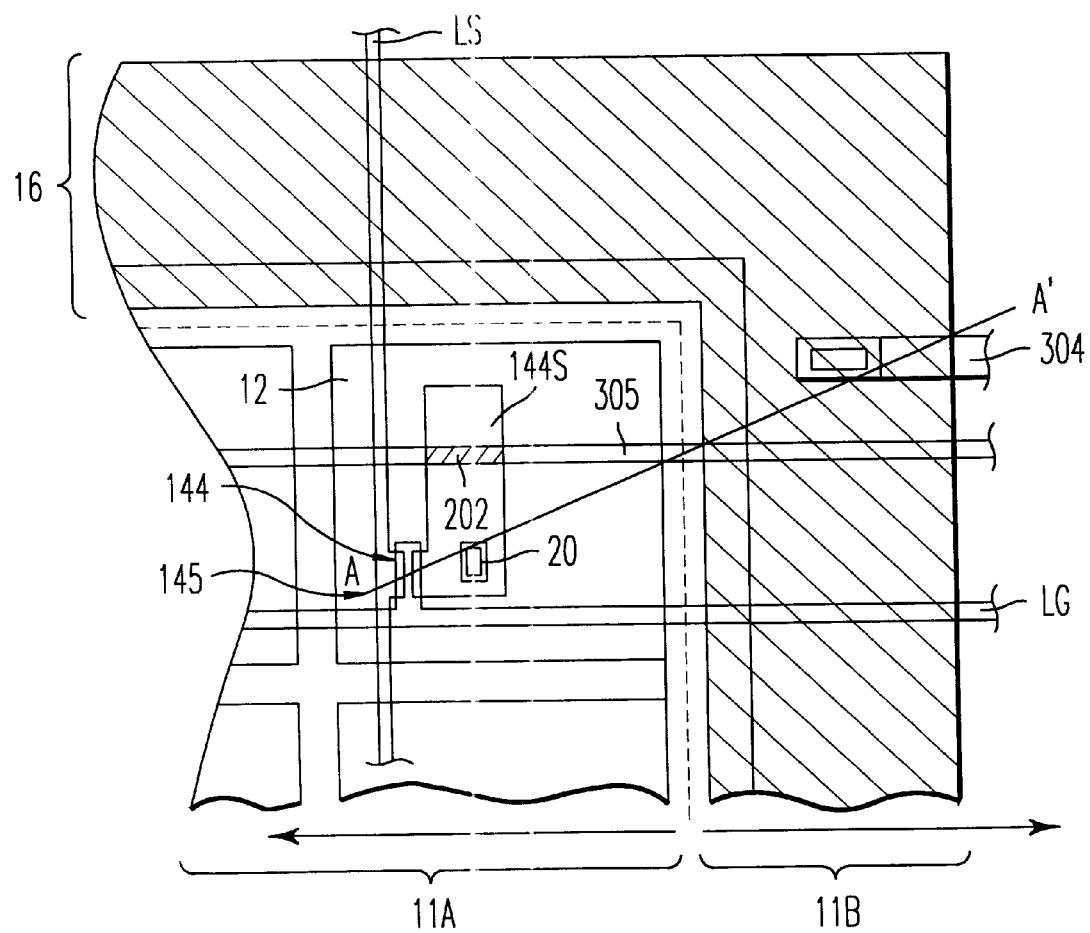
FIG. 2 is a schematic diagram showing in plan view an exemplary structure of a portion of the image detection device of the present invention.

Referring now to the drawings, wherein like reference numerals designate identical or corresponding parts throughout the several views, and more particularly to FIGS. 1(a) and 1(b) which are schematic illustrations in plan view and in sectional view, respectively, of the image detection device of the present invention, it is seen that the image detection device has an image detection area 11a in which pixel electrodes are disposed in a matrix on a first face of an insulating film 11 and a peripheral area 11b surrounding the image detection area 11a. Typical sizes of the image detection device, in terms of the size of the image detection area 11a, are 6, 9 and 12 inches, for example. The width of the peripheral area 11b is about 1 inch. However, the size of the image detection device is selected corresponding to an object to be photographed and is not confined only to the sizes mentioned here.

A photoelectric converting film 13 is provided on the plane for forming the pixel electrodes on the insulating film 11 so as to cover at least the image detection area 11a. A conductive film 14 is disposed on the photoelectric converting film 13 so as to cover the image detection area 11a as a means for applying bias voltage to the photoelectric converting film 13.

A driving circuit 15 for accumulating electric charge induced by the pixel electrodes and for outputting it selectively is disposed on an array substrate 10. The driving circuit 15 is connected with the pixel electrodes on the side opposite from the plane for forming the pixel electrodes of the insulating film 11.

The driving circuit 15 includes a storage capacitor element Cs for accumulating the electric charge induced by the pixel electrodes, a thin film transistor, i.e., a switching element, for selectively outputting the charge stored in the storage capacitor element Cs, and wires such as a scan line Lg and a signal line Ls which are connected thereto as described later.

Then, a shield electrode 16 which provides electromagnetic shielding between the driving means 15 and the bias voltage applying conductive film 14 is disposed in the peripheral area 11b on the first face of the insulating film 11 where the pixel electrodes are disposed. A constant potential such as ground potential is applied to the shield electrode 16 to prevent high voltage from being applied to the driving means 15 disposed in the peripheral area 11b. The potential applied to the shield electrode 16 may be applied thereto via a nonlinear element such as a diode.

A more concrete structural example of the inventive image detection device will be explained below.

Figure 3:
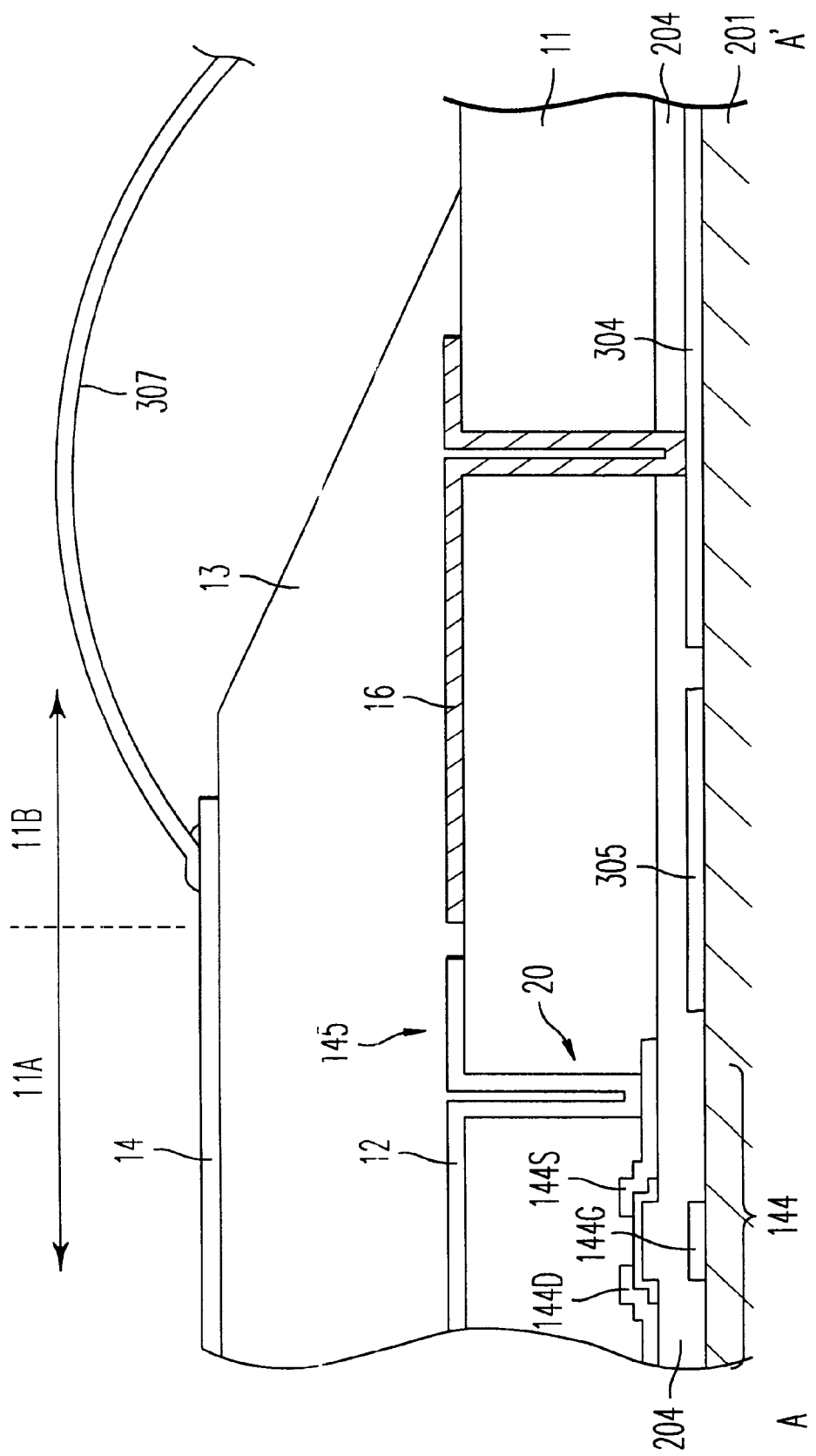
FIG. 3 is a schematic diagram showing a sectional view of the image detection device in FIG. 2 along a line A–A'.

FIG. 2 is a schematic diagram showing in plan view an exemplary structure of the image detection device of the present invention, and FIG. 3 is a schematic diagram sectionally showing exemplary structure of the image detection device shown in FIG. 2 taken along a section 3A–3A'.

Figure 11A:
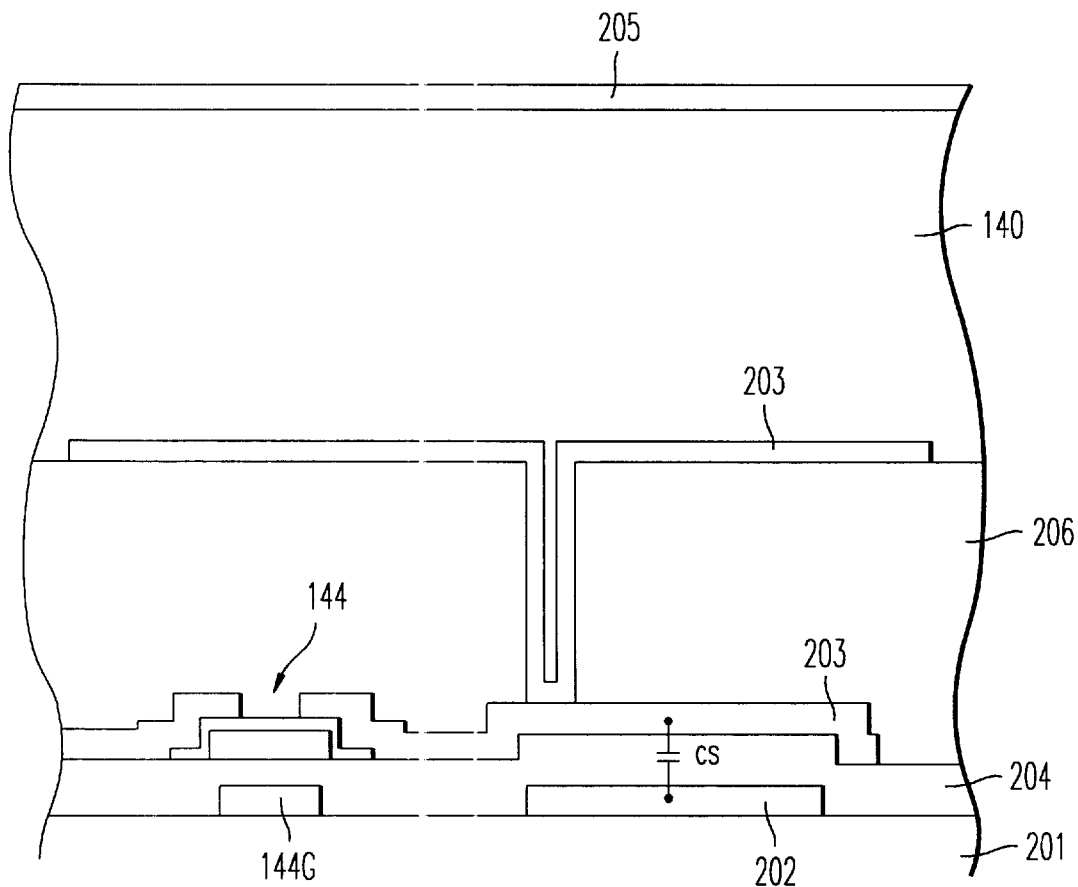
FIGS. 11(a) and 11(b) are diagrams schematically showing a basic structure of the prior art direct conversion image detection device.
Figure 11B:
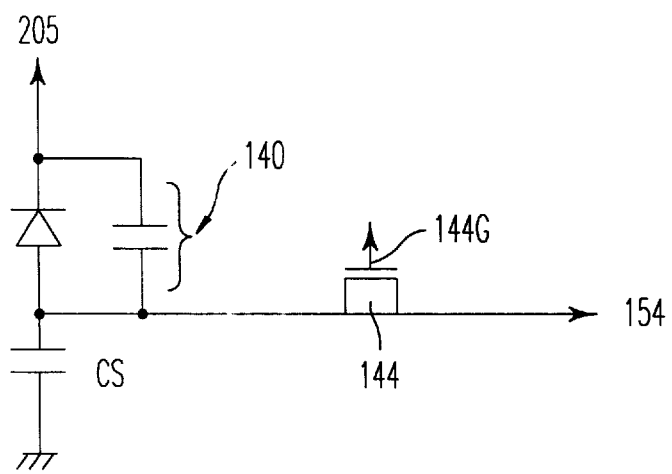
Figure 12:
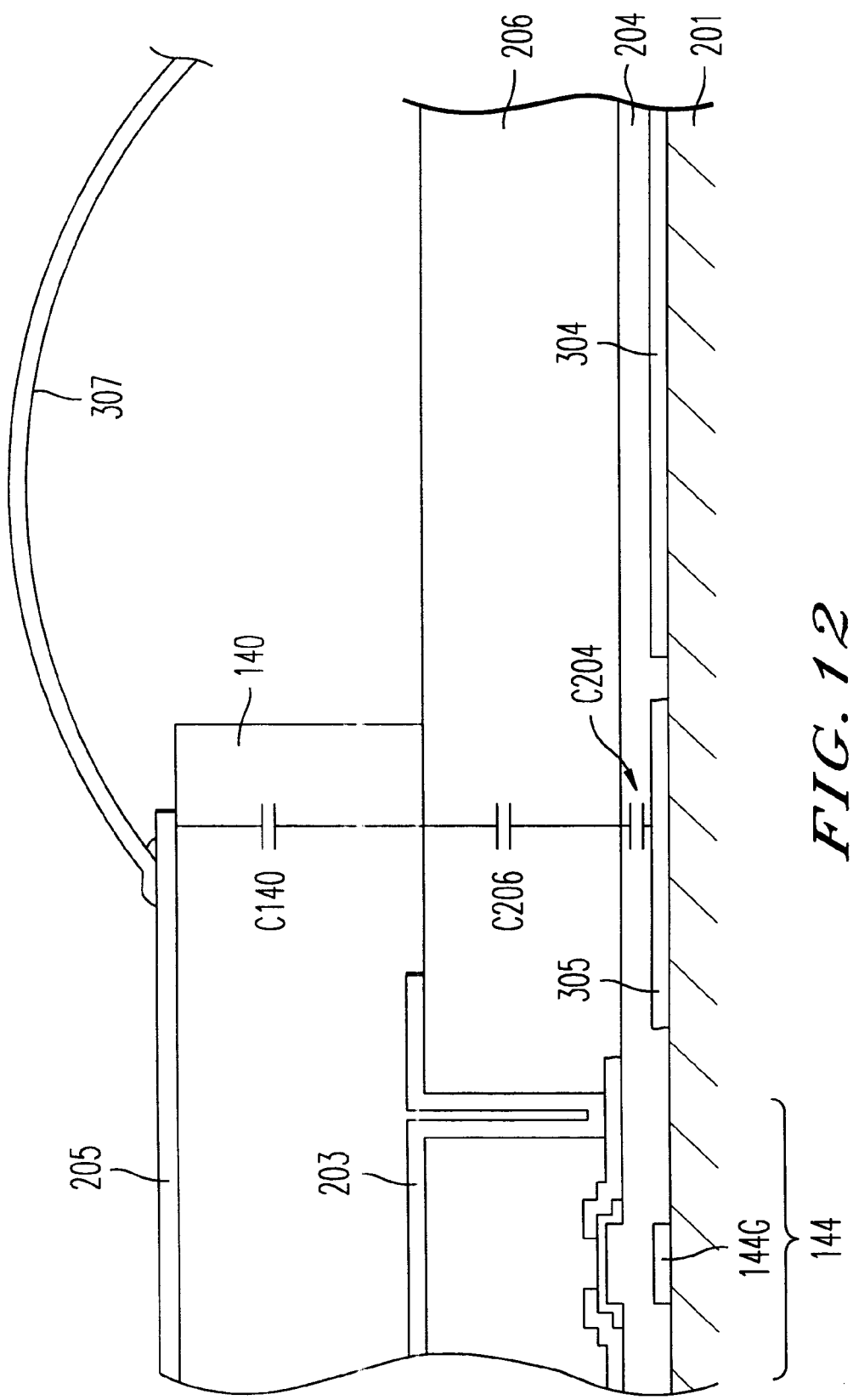
FIG. 12 is a diagram for explaining a peripheral section of the prior art direct conversion image detection device.

Similarly to the device shown in FIG. 11, an a-Si TFT 144, a storage capacitor electrode 202, a pixel electrode 12, an insulating layer 204, the photoelectric converting film 13 and the conductive film 14 which transmits X-rays are disposed on an insulated substrate 201. The TFT 144 and the strorage capacitor 202 form a photoelectric conversion circuit 145. The insulated substrate 201 is made of glass, for example. The size of the a-Si TFT 144 is about 15 $\mu$m in channel width and about 12 $\mu$m in channel length. However, it is possible to use a-Si TFTs of various size as necessary. The pixel electrode 12 is around 50 to 200 $\mu$m or preferably around 100 to 150 $\mu$m. The thickness of the insulating layer 204 is around 0.3 to 0.35 $\mu$m for example. The photoelectric converting film 13 is made of Se, $PbI_2$ and Te and its thickness is about 500 $\mu$m to about 1 mm and preferably around 1 mm.

There are also provided the scan line Lg, the signal line Ls and a power line 305. The scan line Lg, the signal line Ls and the power line 305 are conductive wires and their thickness is around 0.2 to 0.35 $\mu$m for example. A part of the power line 305 which overlaps with a source electrode 144s of the a-Si TFT 144 is the storage capacitor electrode 202. The storage capacitor element Cs is constructed by the storage capacitor electrode 202 and the source electrode 144s of the a-Si TFT 144. An amount of electric charge corresponding to a quantity of incident light is accumulated in the storage capacitor element Cs. The insulating film 11 is laminated on the signal line Ls, the scan line Lg and the power line 305. The conductive film 14 is connected with a high voltage source 308 via a high-voltage power cable 307.

The image detection area 11a in which pixel electrodes 12 are arrayed two-dimensionally in a matrix and the peripheral area 11b which surrounds the periphery of the image detection area 11a are created on one face of the insulating film 11. The face of the insulating film 11 where the photoelectric converting film 13 is disposed will be referred to as the first face and the face on the opposite side where source electrode 144s of the a-Si TFT 144 is provided will be referred to as a second face.

The pixel electrode 12 on the first face of the insulating film 11 is connected with the storage capacitor element Cs disposed on the second face of the insulating film 11 via a through hole 20.

When a scan signal is applied to a gate electrode 144g of the a-Si TFT 144 from a scan line driving circuit not shown via the scan line Lg, the charge accumulated in the storage capacitor element Cs is outputted to the signal line Ls from the source electrode 144s via a drain electrode 144d.

Plural pixels Pm, n, each having a picture unit element such as the above-mentioned pixel electrode 12, are arrayed in a matrix in the image detection area 11a. Image data may be obtained by accumulating charge corresponding to a quantity of incident light stored in each respective storage capacitor element Cs in each pixel, and by reading the accumulated charge via the signal line Ls. It is noted that the signal line Ls may be connected with an amplifier such as a sense amplifier to output an amplified signal.

Wires such as the signal line Ls, the scan line Lg and the power line 305 are disposed also in the peripheral area 11b, other than the image detection area 11a. The scan line driving circuit and the amplifier may be disposed within the peripheral area 11b or may be disposed outside the peripheral area 11b and connected thereto.

The shield electrode 16 is disposed in the peripheral area 11b on the first face of the insulating film 11 in the image detection device as shown in FIGS. 2 and 3. The shield electrode 16 is a conductive and may be made of metal. While it is possible to change the thickness thereof as necessary, a typical thickness is around 0.1 to 0.3 $\mu$m, for example. There is also provided an electrode 304 as a means for maintaining the shield electrode 16 at arbitrary potential. A through hole for contacting the electrode 304 with the shield electrode 16 is created through the insulating film 11. The shield electrode 16 is connected with the electrode 304 and is fixed at constant potential.

The photoelectric converting film 13 and the conductive film 14 are formed across the image detection area 11a and the peripheral area 11b. The pixel electrode 12 and the shield electrode 16 are formed on the insulating film 11. The conductive film 14 is formed within a range not exceeding the peripheral area 11b. Accordingly, the conductive film 14 is disposed so that the edge thereof faces the shield electrode 16.

The electrode 304 disposed on the insulated substrate 201 is connected with an external power source of arbitrary potential, e.g., 0 V, is applied thereto.

When the shield electrode 16 is 0 V for example and when the signal line Ls, the scan line Lg and the power line 305 are set within a range from 0 to 30 V, for example, a maximum voltage of only about 30 V is applied to the insulating film 11. Accordingly, no dielectric breakdown occurs during the normal production process or during normal use.

A high voltage of several kV applied to the conductive film 14 is applied only to the photoelectric converting film 13 between the conductive film 14 and the shield electrode 16. Further, because the driving circuit 15 disposed in the peripheral area 11b on the second face of the insulating film 11 may be effectively protected even when intense X-rays enter during photographing, for example, the image detection device of the present invention can accommodate incident light having a large dynamic range. Further, the photographing sensitivity may be enhanced because the bias voltage may be large.

Also, it is noted that a slight misalignment occurs in forming each layer in producing the substrate in which the thin film transistor array is disposed in a matrix as above described. Therefore, it is necessary to design each layer with a margin so that the misalignment will not affect the performance of the image detection device.

Figure 4:
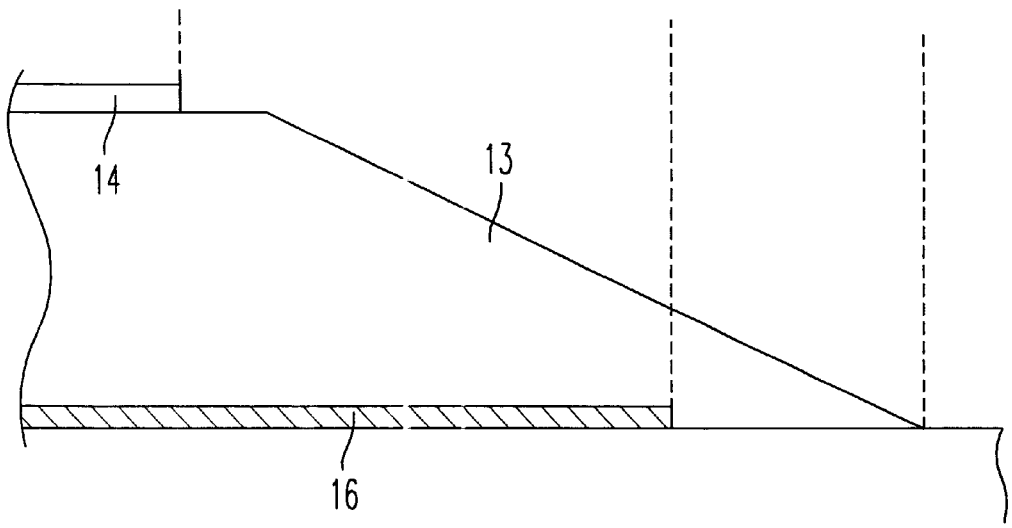
FIG. 4 is a schematic diagram showing the positional relationship among a shield electrode, a photoelectric converting film and a conductive film.

FIG. 4 is a schematic diagram showing the positional relationship among the shield electrode 16, the photoelectric converting film 13 and the conductive film 14. As shown in FIG. 4, the edge of the conductive film 14 must be covered by the shield electrode 16. It is also desirable that the edge of the shield electrode 16 is covered by the photoelectric converting film 13.

It is an essential condition to dispose the outermost portion of the conductive film 14 so as to face to the shield electrode 16 in order to protect the insulating film 11 and the driving circuit 15 under the shield electrode 16.

It is possible to prevent electric discharge from occurring between the high-voltage power cable 307 and the shield electrode 16 by disposing the outermost portion of the shield electrode 16 so as to be covered by the photoelectric converting film 13. That is, it is possible to suppress the discharge from occurring between the high-voltage power cable 307 having potential of several kV and the shield electrode 16 having potential of around 0 V by interposing the photoelectric converting film 13, which is an insulator, between them. Thereby, the reliability of the image detection device is further increased.

It is noted that another insulator may be disposed between the high-voltage power cable 307 and the shield electrode 16 to prevent discharge from occurring.

Figure 5:
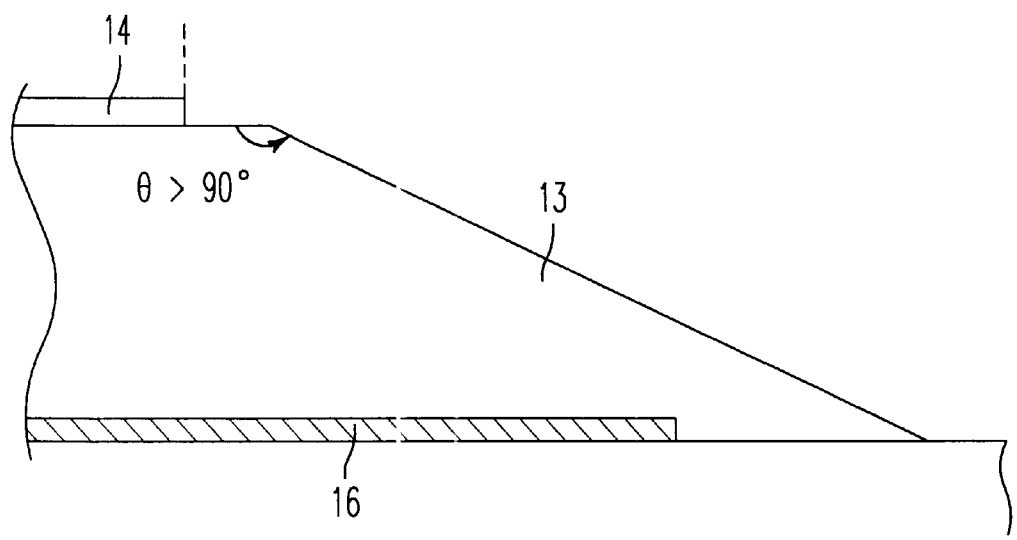
FIG. 5 is a diagram showing a profile of an edge face of the photoelectric converting film.

FIG. 5 is a diagram showing a profile of an edge face of the photoelectric converting film 13. The edge face of the photoelectric converting film 13 is formed so as to have an obtuse angle in this example. That is, the photoelectric converting film 13 is tapered from the vicinity of the outside of the edge of the conductive film 14 to the outside of the outer edge of the shield electrode 16. Or, the photoelectric converting film 13 may be tapered to the outside of the outer edge of the shield electrode 16 by thinning the photoelectric converting film 13 at least from the just inside of the outer edge of the shield electrode 16. This prevents discharge from occurring between the high-voltage power cable 307 and the shield electrode 16.

With the above described construction, shorting between the high-voltage power cable 307 and the electrode 304 or the power line 305 is avoided and it becomes possible to prevent dielectric breakdown of the insulating film 11 from occurring at locations where the shield electrode 16 does not exist.

Figure 6:
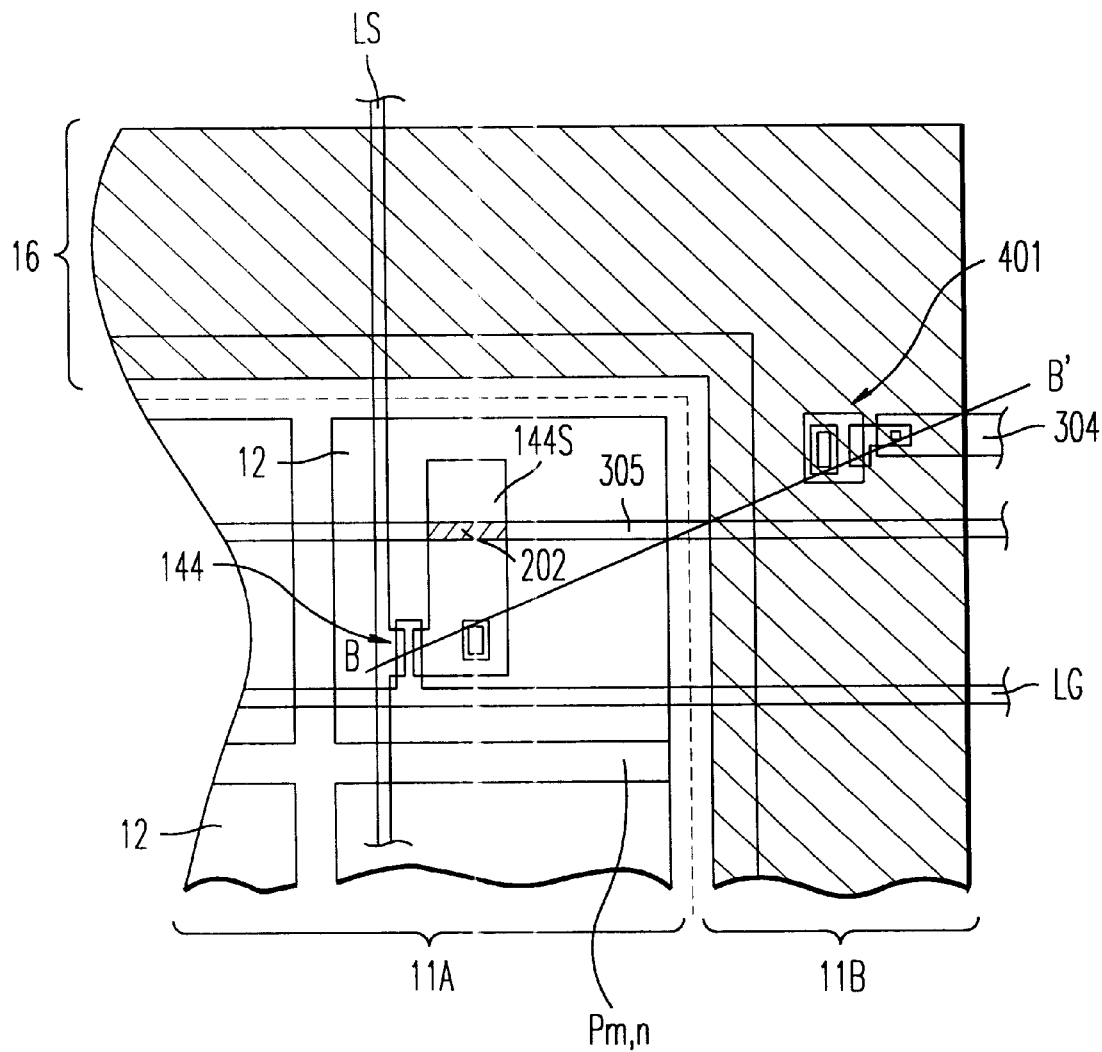
FIG. 6 is a schematic diagram showing another example in plan view of a portion of the image detection device of the present invention.
Figure 7:
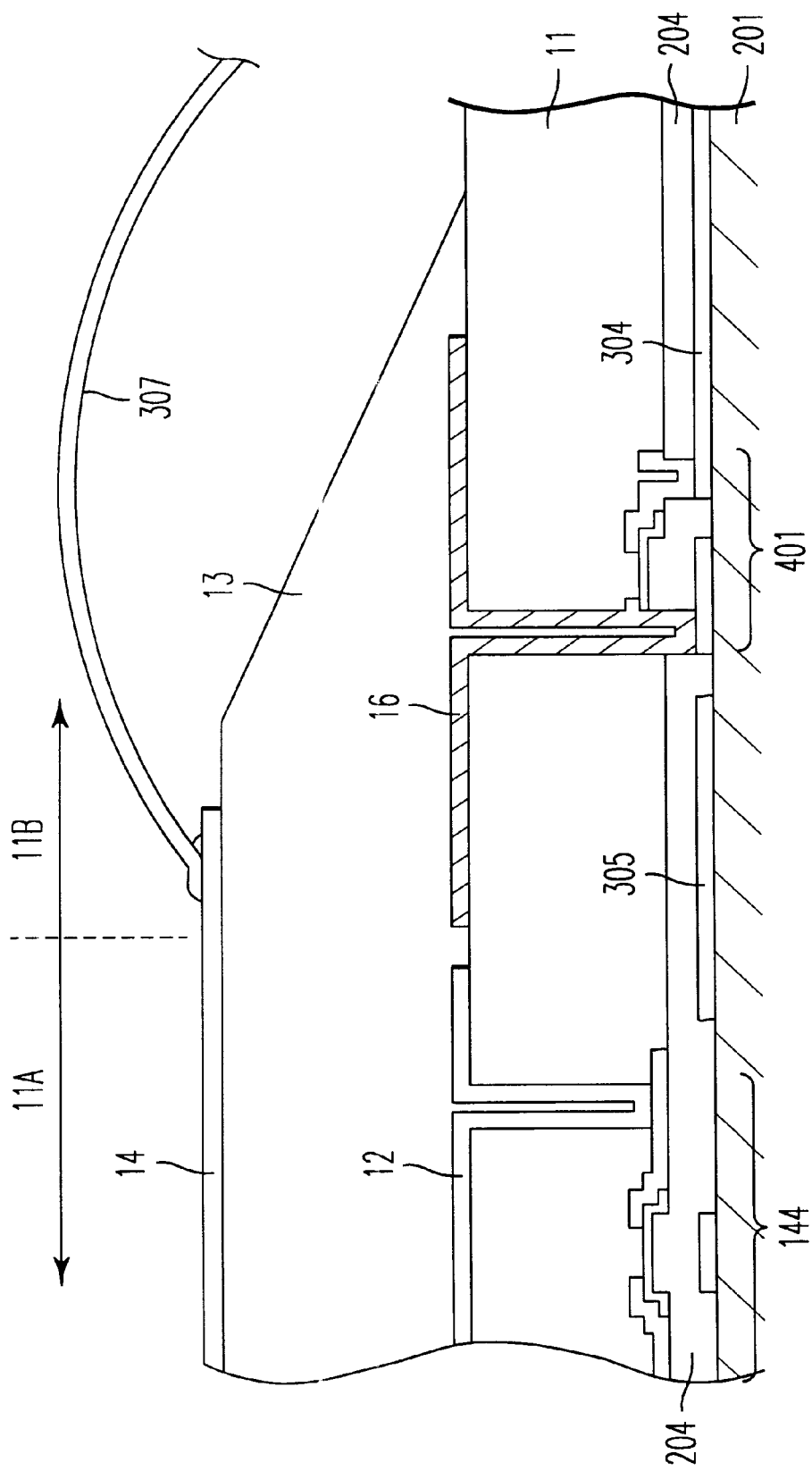
FIG. 7 is a schematic diagram showing a sectional view of the image detection device shown in FIG. 6 along a section B–B'.

FIG. 6 is a schematic diagram showing in plan view another example of the structure of the image detection device of the present invention, and FIG. 7 is a schematic diagram showing a sectional view of the image detection device shown in FIG. 6 taken along a section 7B–7B'. It is noted that like parts previously discussed in relation to FIGS. 2 and 3 are denoted by the same reference numerals and detailed explanation thereof is further omitted.

As shown in FIG. 6, the image detection device of this example includes the image detection area 11a in which pixels Pm, n are arrayed two-dimensionally, and the peripheral area 11b surrounding the image detection area 11a.

With reference also to FIG. 7, the pixel Pm, n including the a-Si TFT 144, the storage capacitor element Cs, the photoelectric converting film 13, the signal line Ls and the scan line Lg are arrayed two-dimensionally in the image detection area 11a on the insulated substrate 201. The storage capacitor element Cs is composed of the source electrode 144s of the a-Si TFT 144 and the storage capacitor electrode 202.

The signal line Ls, the scan line Lg and the power line 305 are disposed in the peripheral area 11b. Beside those wires described above, the shield electrode 16 (hatched portion in the figure) is provided in the peripheral area 11b on the first face of the insulating film 11. Further, the electrode 304 for fixing potential of a diode 401 and the shield electrode 16 at arbitrary potential is formed thereon. The diode 401 is a nonlinear element for protecting the peripheral portion.

The scan line driving circuit and the amplifier may be disposed within the peripheral area 11b or at the periphery of the peripheral area 11b. The photoelectric converting film 13 and the conductive film 14 are formed across the image detection area 11a and the peripheral area 11b. The conductive film 14 is formed within a range not exceeding the peripheral area 11b.

The electrode 304 is connected to the external power source and is fixed at arbitrary potential (e.g., 0 V). The signal line Ls, the scan line Lg and the power line 305 are formed on the insulated substrate 201. A through hole for contacting the periphery protecting diode 401 with the shield electrode 16 is created through the insulating film 11. The pixel electrode 12 and the shield electrode 16 are formed on the insulating film 11. Upon that structure, the photoelectric converting film 13 and the conductive film 14 are laminated. The conductive film 14 is connected with a high voltage source by the high-voltage power cable 307.

Although there is a possibility that a large current flows through the photoelectric converting film 13 right after entry intense X-rays, thus destroying the peripheral circuit (e.g., the external power source) and the driving means, the adoption of the diode 401 allows to restrict the current from flowing to the external power source, thus preventing the external power source from being destroyed.

Figure 8A:
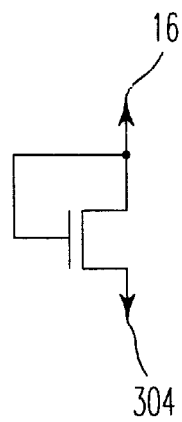
FIGS. 8(a) through 8(d) are equivalent circuit diagrams showing structural examples of diodes.
Figure 8B:
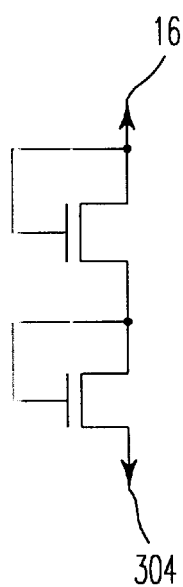
Figure 8C:
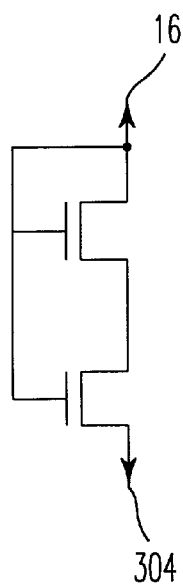
Figure 8D:
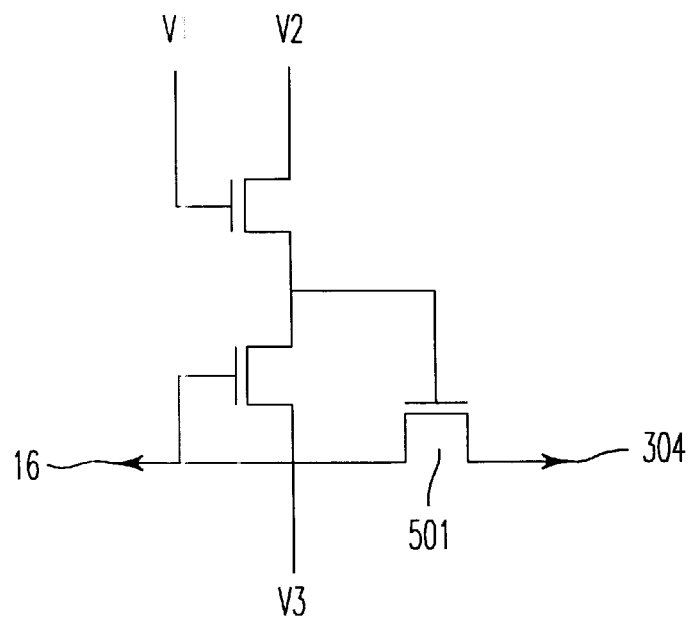
Figure 9:
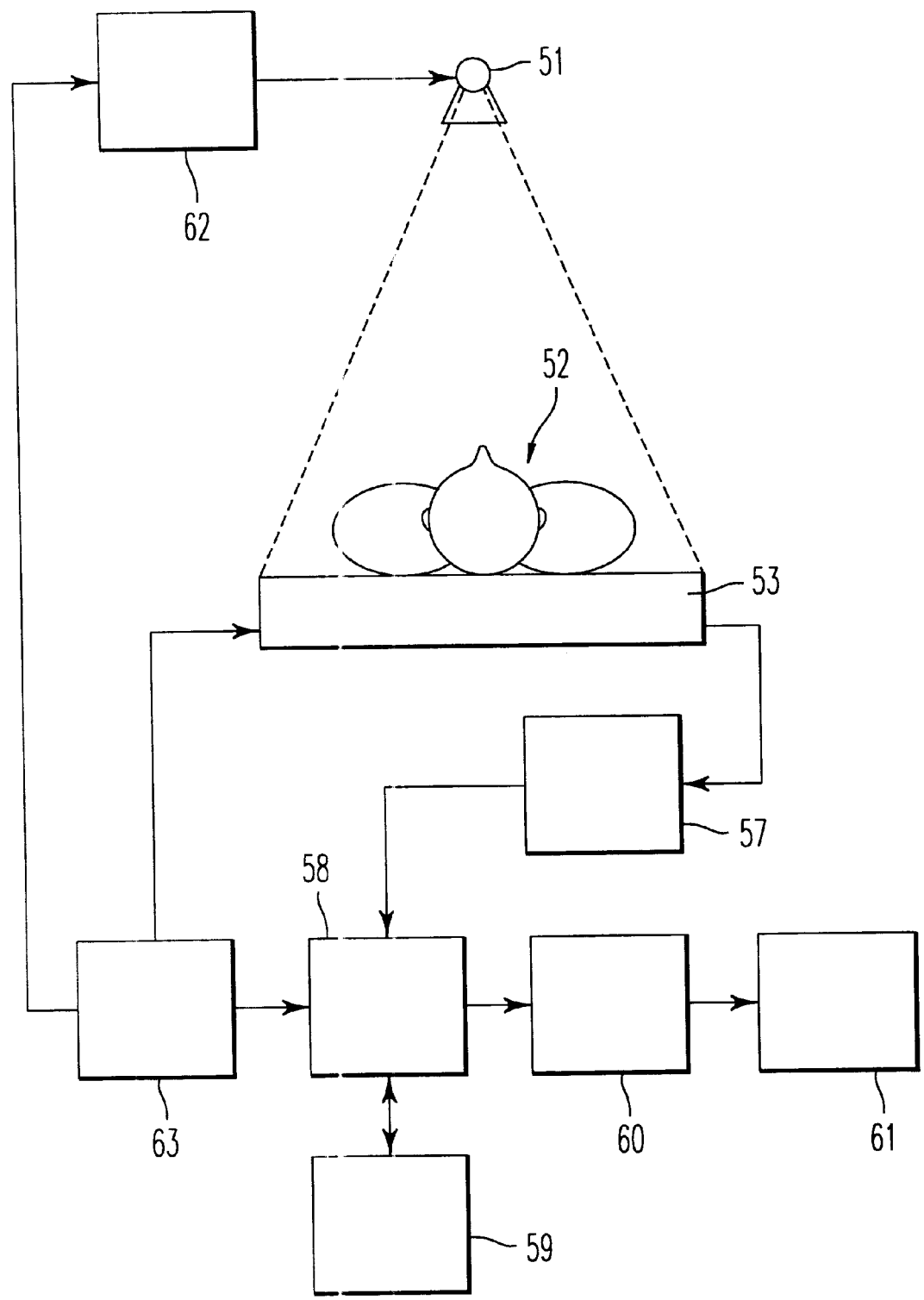
FIG. 9 is a diagram showing a system using the image detection device using thin film transistors.
Figure 10:
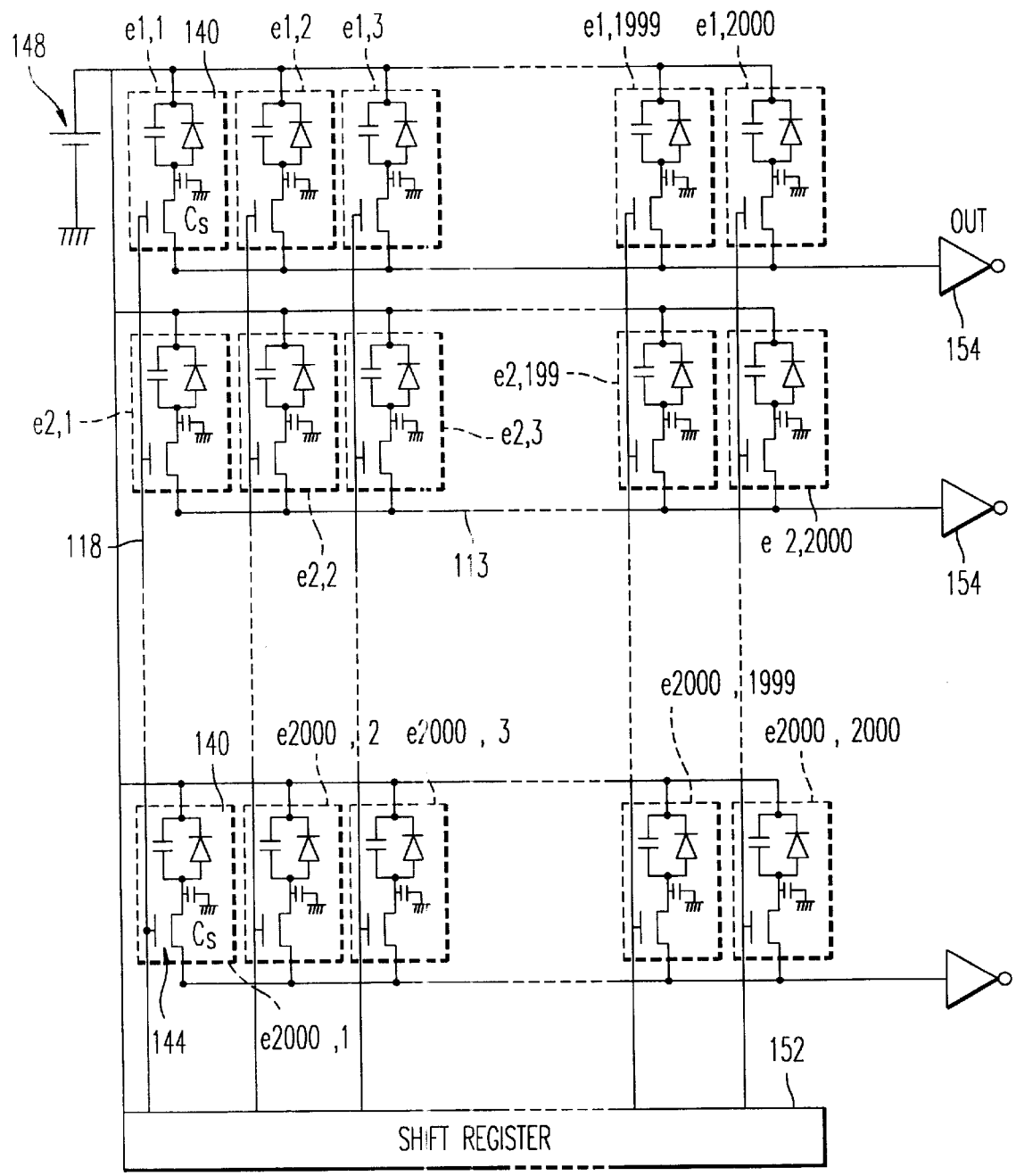
FIG. 10 is an equivalent circuit diagram schematically showing a thin film transistor array section of the image detection device.

FIGS. 8(a) through 8(d) are equivalent circuit diagrams showing structural examples of the protecting diode. The upper part of the diode is connected to the shield electrode 16 and the lower part thereof is connected to the wire 304 in all of FIGS. 8(a), 8(b) and 8(c). In FIG. 8(d), the left terminal is connected to the shield electrode 16 and the right terminal is connected to the wire 304. In the figures, predetermined potentials are supplied from V1, V2 and V3. A potential which is always lower than the potential of the shield electrode 16 by (V2−V1) is supplied to a gate of a TFT 501 connected to the wire 304. That is, the TFT 501 functions as a diode in which Vth is set low by (V2−V1).

Although the diode is formed by one thin film transistor in FIG. 7, it is possible to construct the diode by a plurality of TFTs as shown in FIGS. 8(a)–8(d), for example, or those diodes may be used in combination. Further, the same effect can be obtained by using a nonlinear element having a metal-insulator-metal (MIM) structure.

It is noted that the positional relationship among the shield electrode 16, the photoelectric converting film 13 and the conductive film 14 shown in FIG. 4 may be employed also to the image detection device of this example. The profile of the photoelectric converting film 13 shown in FIG. 5 may be also employed.

Although a thin film transistor using a-Si semiconductor film has been describe as the thin film transistor in the above-explained embodiments of the image detection device of the present invention, a poly-Si TFT, micro-crystal Si TFT ($\mu$-Si TFT) and the like may be also used.

Further, beside the inverse-staggered thin film transistor, a thin film transistor having a staggered structure or a coplanar structure may be also used.

Still further, it is possible to use in combination the method of forming the protecting diode within the pixel as disclosed in Japanese Patent Application Nos. Hei. 8-161977 and Hei. 8-326993, for example. It allows an image detection device capable of displaying video pictures to be more readily realized.

The shield electrode disposed in the peripheral area also has an effect of a short ring, so that it is possible to prevent breakdown of the thin film transistor due to electrostatic electricity during the production of the arrayed substrate. Accordingly, the productivity of the image detection device may be improved.

The shield electrode is disposed in the peripheral area of the image detection area on the first face of the insulating film in the image detection device of the present invention. The adoption of such structure allows to prevent the insulating layer under the pixel electrode from being destroyed by high voltage because the high voltage is applied only to the photoelectric converting film. Accordingly, the structure of the present invention prevents the high voltage from being applied to the wires connecting the elements in the pixel area with the external circuit. Further, the structure of the present invention prevents the high voltage from being applied to the peripheral driving circuit, and then allows pictures to be taken without being limited by the quantity of incident light and the controllability to be improved. Further, because the structure of the present invention allows the bias voltage to be increased, the sensitivity of the photographing may be enhanced.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An X-ray image detect device comprising:
   an insulating substrate;
   a photoelectric conversion circuit provided on said insulating substrate;
   a wiring line, including a portion provided on a periphery of said insulating substrate, and connected to said photoelectric conversion circuit;
   a shield electrode covering the portion of said wiring line provided on the periphery of said insulating substrate;
   a photoelectric conversion film provided on said photoelectric conversion circuit and said wiring line; and
   a conductive layer provided on said photoelectric conversion film and supplied a first constant electrical potential.

2. An X-ray image detect device according to claim 1, wherein said photoelectric conversion film includes Se.

3. An X-ray image detect device according to claim 1, wherein said shield electrode is supplied a second constant electrical potential different from said first constant electrical potential.

4. An X-ray image detect device according to claim 3, wherein said insulating film comprises a contact hole and said shield electrode is supplied said second constant electrical potential through said contact hole.

5. An X-ray detect device according to claim 3, further comprising:

wiring line supplied said second constant electrical potential and connected to said shield electrode.

6. An X-ray detect device according to claim 5, further comprising:

a protect element connected between said wiring line and said shield electrode.

7. An X-ray detect device according to claim 6, wherein said protect element comprises a diode.

8. An X-ray detect device according to claim 6, wherein said protect element comprises a thin film transistor.

9. An X-ray image detect device according to claim 1, wherein said photoelectric conversion circuit comprises:

an insulating film provided on said insulating substrate; and a pixel electrode provided on said insulating film to detect electrical charges from said photoelectric conversion film;

wherein said shield electrode is formed on said insulating film.

10. An X-ray image detect device according to claim 9, wherein said photoelectric conversion circuit further comprises:

a thin film transistor on said insulating substrate, wherein said insulating film covers said thin film transistor, and said pixel electrode is connected to the source of said thin film transistor.

11. An X-ray image detect device comprising:

an insulating substrate;

a wiring line including a portion provided on a periphery of said insulating substrate;

an insulating film provided on said wiring line;

a shield electrode provided on said insulating film and over said portion of said wiring line provided on said periphery of said insulating substrate;

a photoelectric conversion film provided on said shield electrode and having a tapered edge portion; and a conductive layer provided on said photoelectric conversion film and supplied a first constant electrical potential.

12. An X-ray image detect device according to claim 11, wherein said photoelectric conversion film extends to outside of said conductive layer.

13. An X-ray image detect device according to claim 11, wherein said tapered shape defines an obtuse angle on said conductive layer side.

* * * * *